United States Patent [19]
Ezawa et al.

[11] Patent Number: 4,481,265
[45] Date of Patent: Nov. 6, 1984

[54] PHOTOVOLTAIC-STORAGE BATTERY DEVICE

[75] Inventors: Masayoshi Ezawa; Akira Misumi; Kenkichi Suzuki; Masaharu Kumada, all of Mobara, Japan

[73] Assignee: Hitachi, Ltd., Tokyo, Japan

[21] Appl. No.: 502,086

[22] Filed: Jun. 8, 1983

[30] Foreign Application Priority Data

Jun. 11, 1982 [JP] Japan .................................. 57-99231

[51] Int. Cl.³ ..................... H01M 12/00; H01L 31/04
[52] U.S. Cl. ........................................ 429/9; 136/244; 136/258; 136/291; 136/293; 320/2
[58] Field of Search ............... 429/9; 320/2; 136/244, 136/291, 293, 258 AM

[56] References Cited
FOREIGN PATENT DOCUMENTS
53-73988  6/1978  Japan .................................. 136/291

Primary Examiner—Aaron Weisstuch
Attorney, Agent, or Firm—Charles E. Pfund

[57] ABSTRACT

A photovoltaic-storage battery device is disclosed, which comprises a substrate having a pair of major surfaces, a photovoltaic element formed on one major surface of the substrate and including a pair of opposing electrodes and a photoelectric film intervening between the pair of opposing electrodes and a storage battery element formed on the other major surface of the substrate and including a second pair of opposing electrodes which are connectable to the first-mentioned pair of opposing electrodes, respectively, and an electrolyte intervening between the second-mentioned pair of opposing electrodes.

11 Claims, 10 Drawing Figures

PHOTOVOLTAIC-STORAGE BATTERY DEVICE

BACKGROUND OF THE INVENTION

This invention relates to a photovoltaic-storage battery device and, more particularly, a photovoltaic-storage battery device which can serve as a driving power source for various low power consumption apparatus.

Recently, various devices which can convert solar radiation into electric or heat energy have been studied. Among these devices, solar batteries which make use of the photovoltaic effect are attracting attention as most promising products. Semiconductor materials for converting light energy into electric energy are also being extensively studied, and amorphous silicon which can be manufactured inexpensively and on a mass production scale is used for photoelectric films, the advent of amorphous silicon being the greatest technical innovation for increasing efficiency of use of the semiconductor materials. The amorphous silicon film can be formed on a glass substrate, for instance, by means of plasma CVD or glow discharge in an $SiH_4$, $B_2H_6$, or $PH_3$ atmosphere. The substrate on which the amorphous silicon film is formed has been a transparent glass substrate or a thin stainless steel web with an insulating protective film formed on the surface. The stainless steel web is regarded as a promising substrate having flexibility.

However, when the solar battery having the construction as described above is used as a driving power source for a low power consumption device such as a desk calculator or a timepiece in a dark room without illumination, at night, or under the like conditions, it loses photovoltaic function and cannot operate, so that powering of the low power consumption device is prevented.

SUMMARY OF THE INVENTION

The invention contemplates elimination of the above problems, and its object is to provide a novel composite photovoltaic-storage battery device having a photovoltaic element and a storage battery which can store electric energy from the photovoltaic element, thereby permitting use of low power consumption devices in a dark room without illuminating light, at night, or under the like conditions.

According to the invention, the above object is attained by a photovoltaic-storage battery device which comprises a substrate having a pair of major surfaces, a photovoltaic element provided on one of the major surfaces of the substrate and including a pair of electrodes opposing each other and a photoelectric film interposed between the pair of electrodes; and a storage battery element provided on the other major surface and including a second pair of opposing electrodes electrically connectable to the first-mentioned pair electrodes respectively and an electrolyte intervening between the second pair of electrode.

In a modification of the photovoltaic-storage battery device according to the invention, a photovoltaic element is provided on one major surface of a first sub-substrate while a storage battery element is provided on one major surface of a second sub-substrate, and the other major surfaces of the first and second sub-substrates are bonded together. In this instance, the photovoltaic element may be formed independently of the storage battery element or vice-versa because the two elements are formed on the separate sub-substrates. This can alleviate restrictions imposed on fabrication of these elements. For example, where the two elements are otherwise formed on the opposite major surfaces of the same substrate, one element that is to be formed after the formation of the other element must be formed in atmospheres that will have no adverse thermal or other effects on the other element.

BRIEF DESCRIPTION OF THE DRAWINGS

FIGS. 4a through 6d are diagrams showing various different examples of a storage battery element.

DESCRIPTION OF PREFERRED EMBODIMENTS

Figure 1:
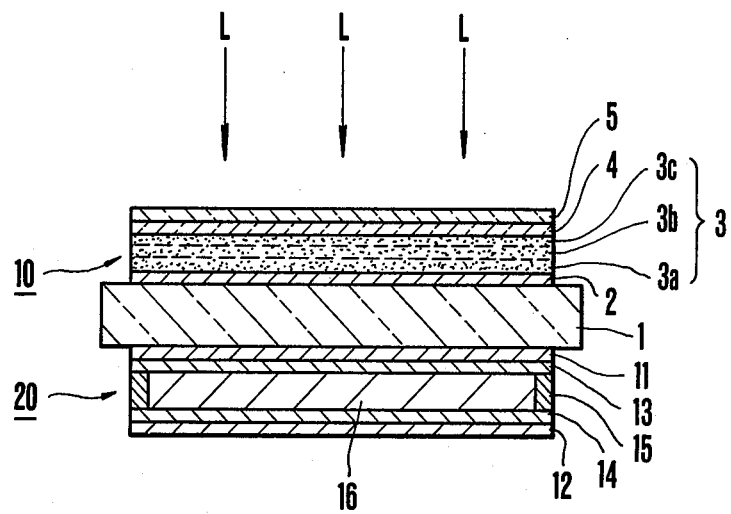
FIG. 1 is a longitudinal sectional view showing an embodiment of the photovoltaic-storage battery device according to the invention.

FIG. 1 shows an embodiment of the photovoltaic-storage battery device according to the invention. The device comprises a photovoltaic element 10, which can convert light energy into electric energy, and a storage battery element 20, which can store electric energy produced from the photovoltaic element. The two elements are integral with each other. More specifically, the photovoltaic element 10 is formed on one major surface of an insulating substrate 1, while the storage battery element 20 is formed on the other major surface of the substrate. The insulating substrate 1 is several of hundreds of microns in thickness and made of a thin glass plate or a stainless steel web with insulating films (not shown) coated on the opposite sides, so that the device can be flexible as a whole. The photovoltaic element 10 includes a lower electrode 2 formed as a power collecting electrode on the substrate 1, an amorphous silicon layer 3 formed on the electrode 2, an upper electrode 4 formed as a power collecting electrode on the amorphous layer 3 and a transparent protective films 5 formed on the upper electrode 4. The amorphous silicon layer 3 has a p-type amorphous silicon layer 3a, an I-type amorphous silicon layer 3b and an N-type amorphous silicon layer 3c, these layers being laminated in the mentioned order on the lower electrode 2. With this construction of the photovoltaic element 10, an electromotive force corresponding to the amount of light incident on the surface of the transparent protective film 5 is produced between the opposing upper and lower electrodes 4 and 2. The storage battery element 20 includes upper and lower electrodes 11 and 12, opposing to each other, a pair of organic films 13 and 14 of polyacetylene $[(CH)_x]$ formed on the respective facing inner surfaces of the upper and lower electrodes 11 and 12, a seal material 15 sealing together the peripheral edges of the facing surfaces of the organic films 13 and 14 and an electrolyte 16 of an organic compound $[(M^+)(C_nH_m)^-]$ filled between the pair of organic films 13 and 14. The electrolyte 16 is a liquid containing a binder resin, an organic solvent and an inorganic element capable of being soluble in the organic solvent and ionized into anions or cations. The electrolyte may also be a mixture of similar liquids.

Figure 2:
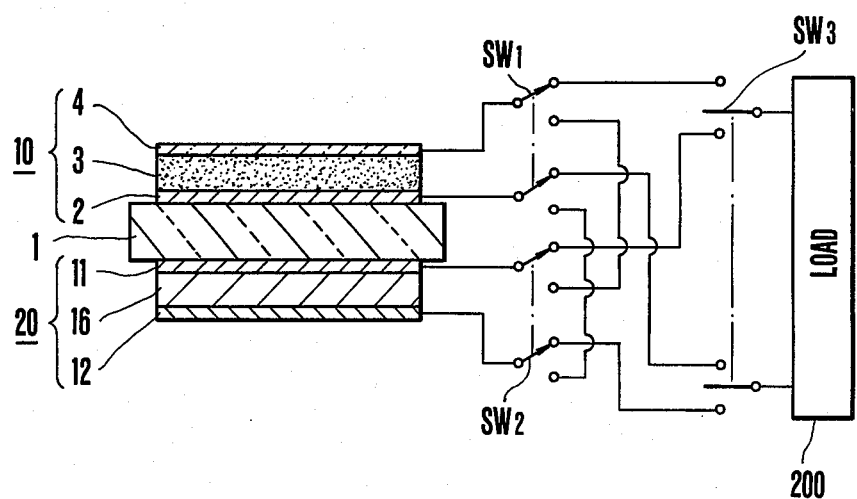
FIG. 2 is a diagram showing the photovoltaic-storage battery device of FIG. 1 together with external connections.

In the above construction of the photovoltaic-storage battery device which comprises photovoltaic element 10 and storage battery element 20 respectively formed on the opposite major surfaces of the substrate 1, the upper and lower electrodes 4 and 2 of the photovoltaic element 10 are adapted for electrical connection to the respective upper and lower electrode 11 and 12 of the storage battery element 20 through switches $SW_1$ and $SW_2$ and lead wires as shown in FIG. 2. When the switches $SW_1$ and $SW_2$ are in the positions shown in FIG. 2, either the output of the photovoltaic element 10 or the output of the storage battery element 20 can be available for being supplied to a load 200. More particularly, in this state the output of the photovoltaic element 10 is supplied to the load 200 by throwing a switch $SW_3$ to the upper side, while the output of the storage battery element 20 is supplied to the load 200 by throwing the switch $SW_3$ to the lower side.

With the photovoltaic-storage battery device, when the switches $SW_1$ and $SW_2$ are thrown to the lower side from the illustrated position, electric energy from the photovoltaic element 10 is applied between the upper and lower electrodes 11 and 12 of the storage battery element 20 through lead wires. Cathode and anode reactions thus take place on the organic films 13 and 14 owing to chemical reactions brought about between either organic film 13 or 14 of polyacetylene $[(CH)_x]$ and the electrolyte 16 of an organic compound $[(M)^+(C_nH_m)^-]$, as expressed by

  (1)

In this way, a storage battery effect can be obtained.

For example, where the electrolyte 16 is a liquid mixture of organic and inorganic substances such as lithium perchlorate, for example, a cathode reaction expressed as

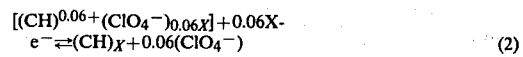  (2)

and an anode reaction expressed as

  (3)

are brought about. As a result, charging and discharging reactions of the storage battery element expressed as

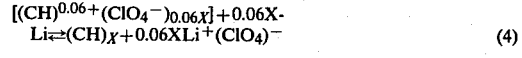  (4)

are caused to obtain electric energy charging and discharging effects.

Figure 3:
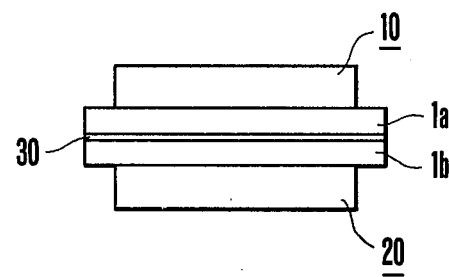
FIG. 3 is a side view showing a modification of the photovoltaic-storage battery device of FIG. 1.
Figure 4:
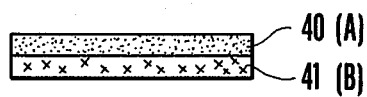
Figure 4:
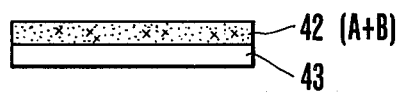
Figure 5:
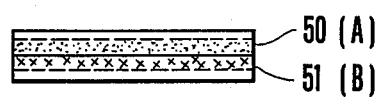
Figure 5:
Figure 6:
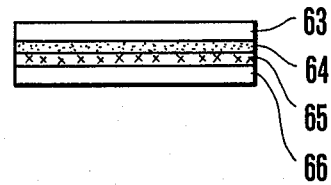
Figure 6:
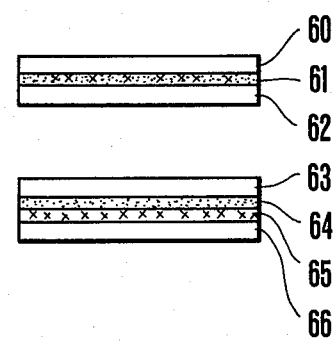

In the previous embodiment, the photovoltaic element and storage battery element are provided on the opposite major surfaces of the substrate 1. FIG. 3 shows a modification of the above embodiment, which is obtained by independently forming a photovoltaic element 10 and storage battery element 20 on one major surface of respective separate sub-substrates 1a and 1b and subsequently bonding together the other major sufaces thereof. The bonding in this case is done by applying an adhesive of an epoxy resin system between the surfaces to be bonded together and heating the adhesive at 70° to 150° C. The modification has the effect of alleviating the restrictions imposed on the fabrication of the individual elements.

Now, modifications of the storage battery element 20 will be described with reference to FIGS. 4a through 6b. The example of FIG. 4a includes films 40 and 41 respectively containing different electrolytes A and B. The lamination of the films 40 and 41 substitutes for the parts 13 to 16 in FIG. 1. Even with this example, the reactions of the equations 2, 3 and 4 can be obtained to achieve entirely the same effects as described above.

The example of FIG. 4b is formed by laminating a film 42 which contains the electrolytes A and B and a film 43 which does not contain any electrolyte.

The examples of FIGS. 5a and 5b include electrolyte-impregnated organic films impregnated at least on the opposing surfaces thereof with a liquid mixture electrolyte. More particularly, in the example of FIG. 5a, a film 50 impregnated with the electrolyte A and a film 51 impregnated with the electrolyte B are laminated such that their impregnated surfaces oppose to each other. In the example of FIG. 5b, the impregnated surface of a film 52 impregnated with the electrolytes A and B is bonded to a film 53 not impregnated with any electrolyte.

In the examples of FIGS. 6a and 6b, the liquid mixture electrolyte containing inorganic and organic substances is solidified, and the solidified electrolytes are formed into a film through an electrochemical process to form a solid electrolyte film. More particularly, the example of FIG. 6a has a lamination of a non-electrolyte film 60, a solid electrolyte film 61 of the electrolytes A and B and a non-electrolyte film 62 laminated in the mentioned order. The example of FIG. 6b has a lamination of a non-electrolyte film 63, a solid electrolyte film 64 of the electrolyte A, a solid electrolyte film 65 of the electrolyte B and a non-electrolyte film 65, these films being laminated in the mentioned order.

Obviously, with these examples, the same effects as described before can be attained.

While in the foregoing embodiments a liquid mixture electrolyte containing an inorganic substance has been used as the electrolyte 16, this is by no means limitative, and the same effects may be obtained by using a liquid mixture electrolyte containing an organic substance capable of being ionized into anions and cations in lieu of the inorganic substance.

Further, while the foregoing embodiments have used organic films as means for interposing the electrolyte between the upper and lower electrodes, this is by no means limitative, and the same effects may be obtained by using inorganic films. Further, the same effects may be obtained by dispensing with organic or inorganic films and providing the liquid or solid electrolyte between the upper and lower electrodes.

Although a single layer of the storage battery element is formed on the back surface of the substrate in the foregoing embodiments, the storage battery element may be provided in the form of multiple layers which are connected in series or parallel. Further, at the cost of impairment of the effect of space saving brought about by vertically stacking the thin photovoltaic and storage battery elements with the inbetween substrate as in the previous embodiments, the two elements may obviously be juxtaposed on the same major surface of the substrate.

Figure 7:
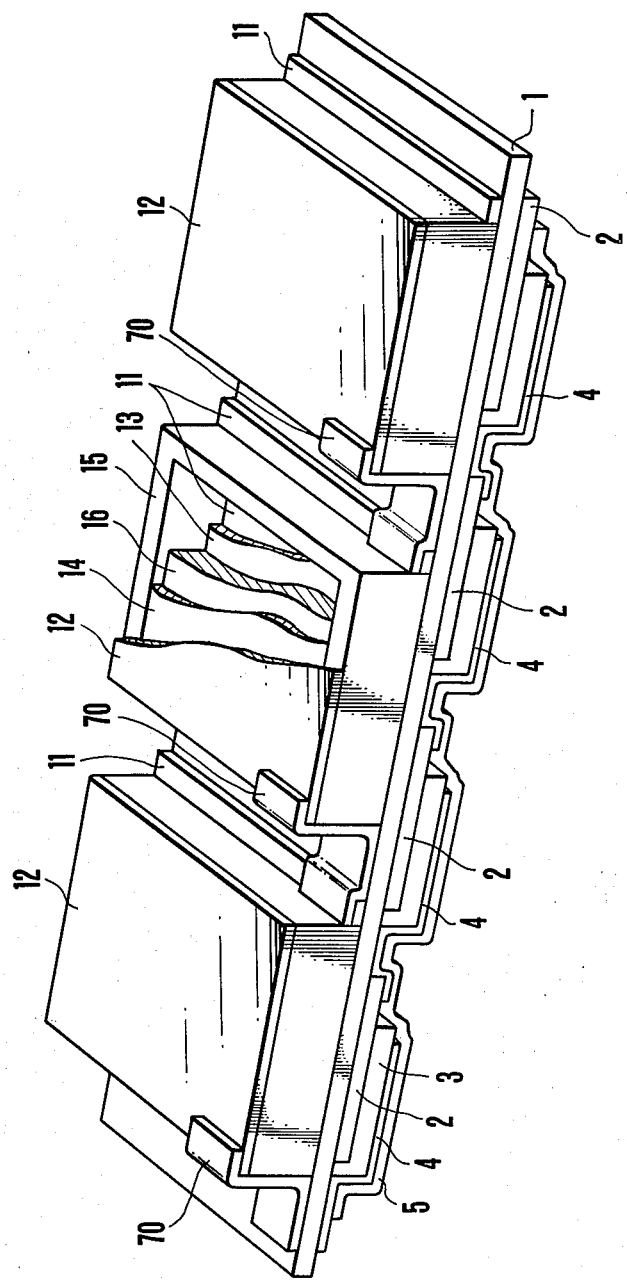
FIG. 7 is a perspective view, partly broken away, showing a photovoltaic-storage battery device assembly according to the invention.

In the foregoing embodiments, a composite unit structure of the photovoltaic-storage battery device comprising one photovoltaic element and one storage battery element has been described. However, the electromotive force that can be obtained from a single photovoltaic element or storage battery element is low, measuring 0.5 to 0.6 V. In actual use, a plurality of series connected photovoltaic elements and a plurality of series connected storage battery elements are employed in an assembly, as shown in FIG. 7. In the Figure, the same parts as those in FIG. 1 are designated by like reference numerals.

The electrode 2 of a photovoltaic element at one end of a photovoltaic element array constitutes an output terminal connected to an external circuit through an external lead (FIG. 2). In the intermediate photovoltaic elements, the electrode 2 is connected to the electrode 4 of the preceding photovoltaic element. The electrode 2 of a photovoltaic element at the other end of the photovoltaic element array is connected to the electrode 4 of the preceding photovoltaic element. The electrode 4 of the photovoltaic element at the other end constitutes an output terminal connected to the external circuit through a lead. Likewise, in a storage battery element array, the electrode 11 of an element at one end of the array constitutes an output terminal. The electrodes 11 and 12 of adjacent elements are interconnected through a conductor piece 70. The electrode of an element at the other end of the array is connected to the conductor 70 thereby constituting an output terminal.

In this photovoltaic-storage battery device assembly, the number of photovoltaic elements and the number of storage battery elements are selected such that the voltage of the former elements matches the voltage of the latter elements.

As has been described in the foregoing, the photovoltaic-storage battery device according to the invention comprises a photovoltaic element and a storage battery element, these elements being made integral, so that excessive electric energy can be stored. Thus, while it can be used as a driving power source for various low power consumption devices, it permits great extension of the range of utilization of these low power consumption devices; for instance, permitting the use of the devices in a dark room without illuminating light, or at night.

What is claimed is:

1. A photovoltaic-storage battery device comprising:
    an elongated thin metal strip substrate having a pair of major surfaces each with an insulating film formed thereon.
    a plurality of photovoltaic elements formed on one insulated major surface of said substrate each photovolatic element including a first pair of spaced electrodes opposing each other and an amorphous silicon film intervening between each said first pair of opposing electrodes;
    a plurality of storage battery elements formed on the other major insulated surface of said substrate, each storage battery element including a second pair of spaced opposing electrodes and an electrolyte intervening between each said second pair of opposing electrodes; and
    electrical connections between said plurality of photovoltaic elements and said storage battery elements to form a multicell source of solar electric power with corresponding storage battery reserve power.

2. A photovoltaic-storage battery device according to claim 1, wherein said substrate is comprised of first and second sub-substrates, said photovoltaic elements being formed on one major insulated surface of said first sub-substrate, said storage battery elements being formed on one major insulated surface of said second sub-substrate, the other major surfaces of said first and second sub-substrates being bonded together.

3. A photovoltaic-storage battery device according to claim 1, wherein each said photovoltaic element further includes a protective film formed on one of said first pair of electrodes.

4. A photovoltaic-storage battery device according to claim 1, wherein each said storage battery element further includes organic films having a charge storage effect and intervening between each said second pair of opposing electrodes.

5. A photovoltaic-storage battery device according to claim 1, wherein each said storage battery element further includes inorganic films intervening between each said second pair of opposing electrodes.

6. A photovoltaic-storage battery device according to claim 1, wherein said electrolyte is a liquid mixture electrolyte containing an organic substance.

7. A photovoltaic-storage battery device according to claim 1, wherein said electrolyte is a liquid electrolyte containing an inorganic substance.

8. A photovoltaic-storage battery device according to claim 1, wherein said electrolyte is a solid electrolyte containing an organic substance.

9. A photovoltaic-storage battery device according to claim 1, wherein said electrolyte is a solid electrolyte containing an inorganic substance.

10. A photovoltaic-storage battery device according to claim 1, wherein said thin metal substrate is a thin stainless steel substrate.

11. A photovoltaic-storage battery device comprising:
    a thin metal substrate having a pair of major surfaces each with an insulating film formed thereon;
    a plurality of photovoltaic amorphous silicon elements formed on one major surface of said substrate and connected in series; and
    a plurality of storage battery elements formed on the other major surface of said substrate and connected in series;
    each of said photovoltaic elements including a pair of opposing electrodes and a photoelectric film intervening between said opposing electrodes, one of the pair of opposing electrodes of a pair of adjacent photovoltaic elements and the other electrode of the other adjacent photovoltaic element of said pair of adjacent photovoltaic elements being electrically connected together; each of said storage battery elements including a pair of opposing electrodes and an electrolyte intervening between said pair of opposing electrodes, one of the pair of opposing electrodes of a pair of adjacent storage battery elements and the other electrode of the other adjacent storage battery element of said pair of adjacent storage battery elements being electrically connected together; the number of said photovoltaic elements and the number of said storage battery elements being selected such that the voltage of the group of photovoltaic elements and the voltage of the group of storage battery elements match with each other.

* * * * *